(12) United States Patent
Yang

(10) Patent No.: US 8,823,432 B2
(45) Date of Patent: Sep. 2, 2014

(54) LOW POWER DATA RECOVERY

(71) Applicant: Intel Corporation, Santa Clara, CA (US)

(72) Inventor: Wei-Lien Yang, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/141,589

(22) Filed: Dec. 27, 2013

(65) Prior Publication Data

US 2014/0103978 A1    Apr. 17, 2014

Related U.S. Application Data

(63) Continuation of application No. 13/535,823, filed on Jun. 28, 2012, now Pat. No. 8,653,868.

(51) Int. Cl.
*H03L 7/06*    (2006.01)

(52) U.S. Cl.
USPC .......................................... 327/158; 327/147

(58) Field of Classification Search
USPC .................................. 327/147, 158
See application file for complete search history.

(56) References Cited

U.S. PATENT DOCUMENTS

| | | | |
|---|---|---|---|
| 4,646,061 A * | 2/1987 | Bledsoe ........................ | 341/65 |
| 5,528,637 A * | 6/1996 | Sevenhans et al. ........... | 375/371 |
| 5,974,097 A * | 10/1999 | Julyan et al. ................. | 375/340 |
| 6,081,561 A * | 6/2000 | Julyan et al. ................. | 375/340 |
| 6,717,542 B2 * | 4/2004 | Harada ........................ | 341/161 |
| 6,775,345 B1 | 8/2004 | Song | |
| 7,057,422 B2 * | 6/2006 | Berg ............................. | 327/77 |
| 7,170,957 B2 * | 1/2007 | Moy et al. .................... | 375/346 |
| 7,184,498 B2 * | 2/2007 | Moy et al. .................... | 375/346 |
| 7,352,305 B2 * | 4/2008 | Kiriyama et al. ............ | 341/116 |
| 8,139,430 B2 * | 3/2012 | Buchmann et al. .......... | 365/201 |
| 8,203,472 B2 * | 6/2012 | Robinson ..................... | 341/118 |
| 8,368,441 B2 * | 2/2013 | Kato ............................ | 327/156 |
| 8,400,198 B1 * | 3/2013 | Kato ............................ | 327/156 |
| 8,653,868 B2 * | 2/2014 | Yang ............................ | 327/158 |
| 2003/0148801 A1 * | 8/2003 | Deyring et al. .............. | 455/701 |
| 2003/0190006 A1 | 10/2003 | Nagano | |
| 2004/0070436 A1 | 4/2004 | Kudo et al. | |
| 2005/0220240 A1 * | 10/2005 | Lesso ........................... | 375/372 |
| 2005/0276318 A1 * | 12/2005 | Bokhour ...................... | 375/219 |
| 2006/0008040 A1 | 1/2006 | Vallet et al. | |
| 2006/0044031 A1 * | 3/2006 | Cheung et al. ............... | 327/157 |
| 2006/0075162 A1 * | 4/2006 | Shiraishi ....................... | 710/52 |

(Continued)

OTHER PUBLICATIONS

International Searching Authority, "Notification of Transmittal of the International Search Report and the Written Opinion of the International Searching Authority," mailed Oct. 16, 2013, in International application No. PCT/US2013/046666.

*Primary Examiner* — Adam Houston
(74) *Attorney, Agent, or Firm* — Trop, Pruner & Hu, P.C.

(57) ABSTRACT

In one embodiment, an apparatus may include a pulse generator to generate an oversampled clock signal. The apparatus may also include a sample and hold unit to provide at least two differential input signals based on the oversampled clock signal. The apparatus may further include a conversion unit to generate a single-ended signal based on the at least two differential input signals. The apparatus may also include a counter to determine a count of rising and falling edges of the single-ended signal based on the oversampled clock signal.

18 Claims, 8 Drawing Sheets

(56) References Cited

U.S. PATENT DOCUMENTS

| | | |
|---|---|---|
| 2006/0109942 A1 | 5/2006 | Vallet |
| 2006/0239383 A1* | 10/2006 | Wang et al. ............... 375/324 |
| 2008/0187080 A1 | 8/2008 | Lee et al. |
| 2008/0235405 A1* | 9/2008 | Sakaguchi .................. 710/15 |
| 2010/0246735 A1* | 9/2010 | Oakley et al. ............... 375/354 |
| 2010/0262880 A1* | 10/2010 | Vergnes et al. ............ 714/746 |
| 2011/0115729 A1* | 5/2011 | Kremin et al. ............ 345/173 |
| 2012/0085174 A1* | 4/2012 | Urbano et al. .............. 73/602 |
| 2012/0242384 A1* | 9/2012 | Kato ........................ 327/157 |
| 2012/0272119 A1* | 10/2012 | Buchmann et al. .......... 714/755 |
| 2013/0033205 A1* | 2/2013 | Furukawa et al. ....... 318/400.02 |
| 2013/0076414 A1* | 3/2013 | Kato ........................ 327/157 |
| 2013/0127385 A1* | 5/2013 | Allison, III .............. 318/400.35 |
| 2013/0342248 A1* | 12/2013 | Yang ........................ 327/158 |
| 2013/0342249 A1* | 12/2013 | Yang ........................ 327/158 |
| 2014/0002153 A1* | 1/2014 | Yang ........................ 327/158 |
| 2014/0103978 A1* | 4/2014 | Yang ........................ 327/160 |

* cited by examiner

LOW POWER DATA RECOVERY

This application is a continuation of U.S. patent application Ser. No. 13/535,823, filed Jun. 28, 2012, the content of which is hereby incorporated by reference.

BACKGROUND

Embodiments relate generally to data interfaces for electronic devices.

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to increasing bandwidth requirements.

DETAILED DESCRIPTION

Figure 1:
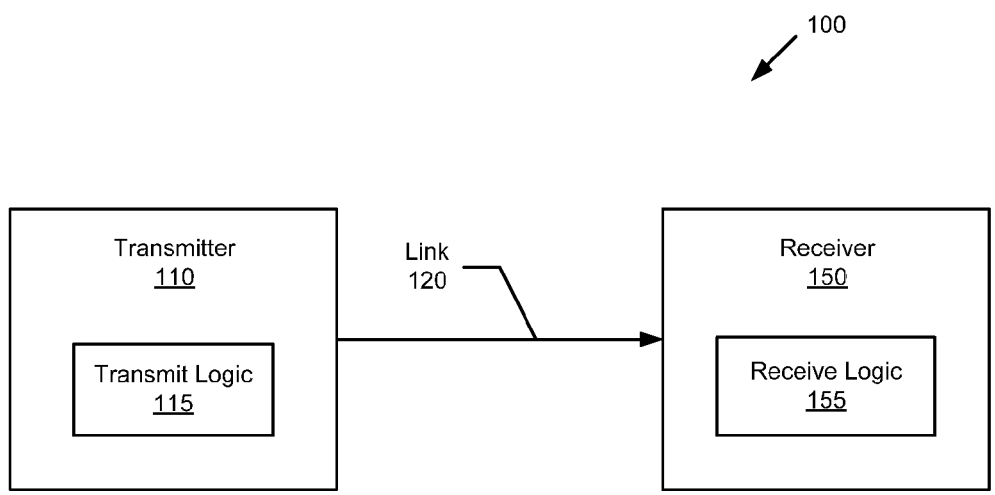
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a link 120 connecting a transmitter 110 and a receiver 150. In accordance with some embodiments, the apparatus 100 may be any electronic device, such as a cellular telephone, a computer, a media player, a network device, etc.

In some embodiments, the transmitter 110 and the receiver 150 may exist to connect any components or peripherals of the apparatus 100, such as a processor, a processor core, a memory device, a display device, a sound device, a wireless transceiver, a camera, etc. For example, in one or more embodiments, the receiver 150 may connect to a processor having a ten bit parallel data path. Note that, while only one pair of transmitter 110 and receiver 150 is shown for the sake of clarity, the example shown in FIG. 1 is not intended to be limiting. Accordingly, it should be appreciated that any number of such transmitter-receiver pairs may exist to connect various components of the apparatus 100.

In accordance with some embodiments, the link 120 may be any electrical or data connection(s) (e.g., motherboard connection, input/output cable, network connector, bus, wireless link, etc.). In one or more embodiments, the transmitter 110 may include transmit logic 115 to manage data connections to the receiver 150. Further, in some embodiments, the receiver 150 may include receive logic 155 to manage the data connections from the transmitter 110.

In accordance with some embodiments, the link 120, the transmit logic 115, and the receive logic 155 may use one or more data interface protocols. For example, in some embodiments, the link 120, the transmitter 110, and the receiver 150 may use the M-PHY specification of the Mobile Industry Processor Interface (MIPI) Alliance (MIPI Specification for M-PHY Version 1.00.00 of Feb. 8, 2011, approved Apr. 28, 2011). In such embodiments, the link 120 may include serial lines carrying differential pulse width modulated (PWM) signals. Optionally, the PWM signals may be referred to as "self-clocking" if clock information is included in the period of the PWM waveform.

In one or more embodiments, the PWM signals of the link 120 may operate under one or more data rate ranges of the M-PHY specification (referred to as "GEARs"). For example, the link 120 may operate under GEAR 1 (3 Mbps to 9 Mbps), GEAR 2 (6 Mbps to 18 Mbps), GEAR 3 (12 Mbps to 36 Mbps), GEAR 4 (24 Mbps to 72 Mbps), GEAR 5 (48 Mbps to 144 Mbps), GEAR 6 (96 Mbps to 288 Mbps), GEAR 7 (192 Mbps to 576 Mbps), etc.

In accordance with some embodiments, the receive logic 155 may include functionality to recover data received from the transmitter 110 (e.g., PWM signals of the link 120). In some embodiments, the receive logic 155 may use an oversampled clock signal to recover the data. Further, in some embodiments, the oversampled clock signal may be generated using less power than that required by conventional techniques (e.g., analog circuits, clock data recovery circuits, etc.). This functionality of the receive logic 155 is described further below with reference to FIGS. 2-5.

In one or more embodiments, the transmit logic 115 and/or the receive logic 155 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
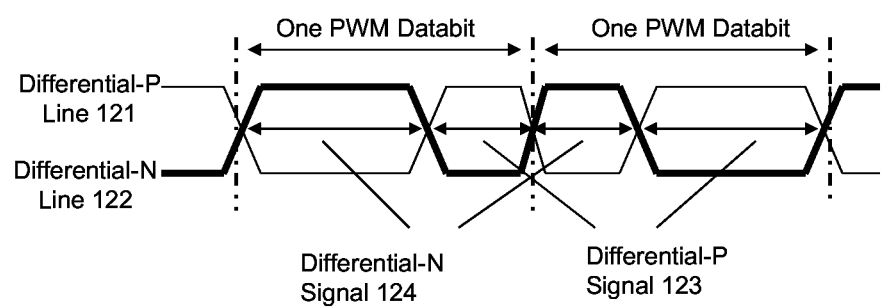
FIG. 2 is an example timing diagram in accordance with one or more embodiments.

Referring to FIG. 2, shown is a timing chart of a system in accordance with one or more embodiments. The timing chart shows an example of power states (i.e., voltage levels) of differential-p line 121 and differential-n line 122 with respect to time. In some embodiments, the differential lines 121 and 122 may transport differential PWM signals, and may together correspond generally to the link 120 shown in FIG. 1.

In one or more embodiments, the differential lines 121 and 122 may be sampled for a designated time period of data transfer between transmitter and receiver to determine how the transferred data (e.g., a single PWM data bit) may be expressed. For example, as shown, the transferred data bit may constitute a differential-p signal 123 when the differential-p line 121 is in a high power state and the differential-n line 122 is in a low power state during the sampled time period. Otherwise, the transferred data bit may constitute a differential-n signal 124 when the differential-n line 122 is in a high power state and the differential-p line 121 is in a lower power state during the sampled time period. In one or more embodiment, the differential lines 121 and 122 may be received and processed by the receive logic 155 shown in FIG. 1.

Figure 3:
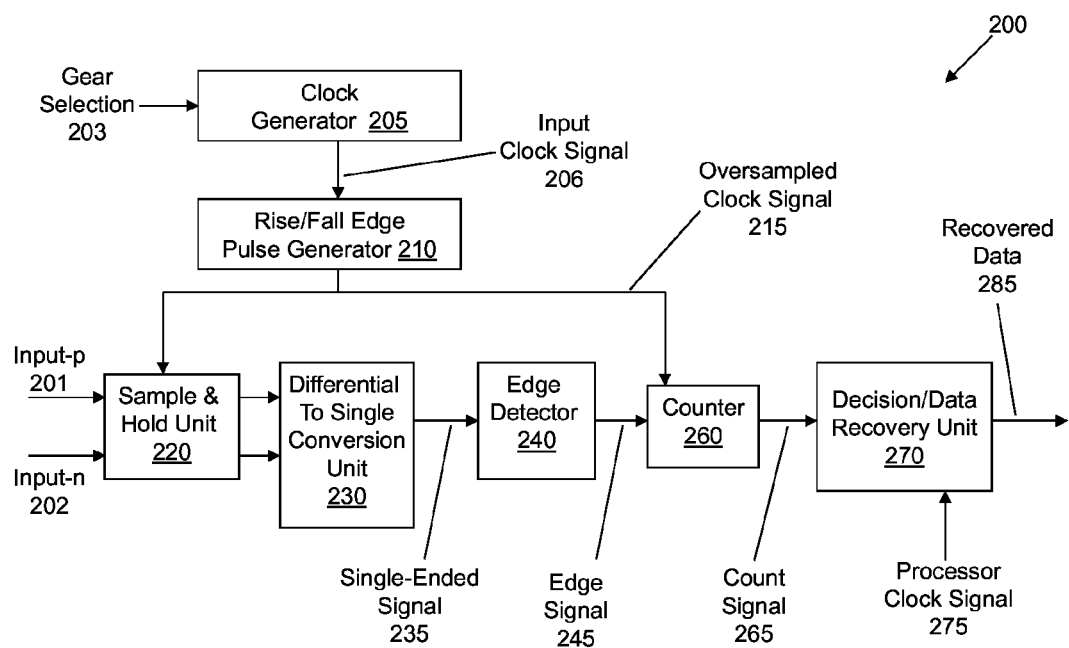
FIG. 3 is a block diagram of a system in accordance with one or more embodiments.

Referring to FIG. 3, shown is a block diagram of a receive logic 200 in accordance with one or more embodiments. More specifically, the receive logic 200 may generally correspond to all or a portion of the receive logic 155 shown in FIG.

1. As shown, in some embodiments, the receive logic 200 may include a clock generator 205, a rise/fall edge pulse generator 210, a sample and hold unit 220, a differential-to-single conversion unit 230, an edge detector 240, a counter 260, and a decision/data recovery unit 270.

In accordance with some embodiments, the clock generator 205 may receive a gear selection input 203. The gear selection input may be any identifier or other selective means used to identify any one of a number of gears. In some embodiments, the gear selection input may correspond generally to one of the gears defined by the MIPI Alliance M-PHY specification.

In one or more embodiments, the clock generator 205 may include functionality to generate an input clock signal 206. For example, in some embodiments, the clock generator 205 may include a delay locked loop (DLL), a phase locked loop (PLL), and/or any similar components. Further, in one or more embodiments, the clock generator 205 may generate the input clock signal 206 by oversampling a received reference clock signal. For example, in some embodiments, the clock generator 205 may receive a processor clock signal (not shown), and may generate the input clock signal 206 to be a multiple (e.g., 6×, 12×, etc.) of the processor clock signal.

In one or more embodiments, the input clock signal 206 may be provided to the rise/fall edge pulse generator 210. In some embodiments, the rise/fall edge pulse generator 210 may include functionality to oversample the input clock signal 206 to obtain an oversampled clock signal 215. For example, the rise/fall edge pulse generator 210 may generate a pulse at every rising and falling edge of the input clock signal 206. As such, the frequency of the input clock signal 206 may be doubled by the oversampling logic of the rise/fall edge pulse generator 210 to generate the oversampled clock signal 215. In this manner, generating the oversampled clock signal 215 may require less power than conventional techniques for generating clock signals to match a selected gear. In some embodiments, the oversampled clock signal 215 may correspond to a pair of differential clock signals.

In accordance with some embodiments, the sample and hold unit 220 may receive two differential signals input-p 201 and input-n 202 (e.g., PWM signals received over the differential-p line 121 and the differential-n line 122 shown in FIG. 2). The sample and hold unit 220 may also receive the oversampled clock signal 215 as an input.

In one or more embodiments, the sample and hold unit 220 may include functionality to sample differential signals input-p 201 and input-n 202 for some time period based on the oversampled clock signal 215 (e.g., a cycle, half a cycle, etc.). Further, the sample and hold unit 220 may also include functionality to hold the differential signals 201, 202 for another time period based on the oversampled clock signal 215. In some embodiments, the sample time period and the hold time period may be equal. After holding the differential signals 201, 202 for the designated time period, the sample and hold unit 220 may transmit the differential signals 201, 202 to the differential-to-single conversion unit 230. In this manner, the sample and hold unit 220 may enable the input differential signals 201, 202 to be synchronized with the oversampled clock signal 215, thus facilitating data recovery (described below). In one or more embodiments, the sample and hold unit 220 may be any device or circuit capable of sampling a series of input signals that are buffered and then released upon the completion of a specified timing period.

In one or more embodiments, the differential-to-single conversion unit 230 receives the differential signals 201, 202 from the sample and hold unit 220. Further, the differential-to-single conversion unit 230 may include functionality to convert the two differential signals 201, 202 to a single-ended signal 235 (e.g., a PWM signal). As shown, in one or more embodiments, the single-ended signal 235 may be provided to the edge detector 240.

In accordance with some embodiments, the edge detector 240 may include functionality to process the single-ended signal 235 to determine the occurrence of rising and falling edges in the single-ended signal 235. Further, in some embodiments, the edge detector 240 may provide an edge signal 245 to indicate the detection of rising and falling edges in the single-ended signal 235. For example, in one or more embodiments, the detection of a rising edge may result in the edge detector 240 providing a count-up indication in the edge signal 245 (e.g., a positive bit, number, symbol, etc.). Further, the detection of a falling edge may result in the edge detector 240 providing a count-down/reset indication in the edge signal 245.

In one or more embodiments, the counter 260 may include functionality to determine a count based on the edge signal 245 and the oversampled clock signal 215. For example, in some embodiments, the counter 260 may increase the count based on receiving a count-up indication of the edge signal 245 during a time period of the oversampled clock signal 215 (e.g., a cycle, a pulse, etc.). Further, in some embodiments, the counter 260 may decrease the count based on receiving a count-down indication of the edge signal 245 during a time period of the oversampled clock signal 215. In addition, the counter 260 may also include functionality to provide a count signal 265 based on the determined count.

In accordance with some embodiments, the decision/data recovery unit 270 may include functionality to recover data bits based on the count signal 265 and a processor clock signal 275 (e.g., a reference clock signal of a central processor). In one or more embodiments, the decision/data recovery unit 270 may determine a logical high bit value or a logical low bit value based on comparing the count signal 265 to a predefined threshold. For example, in some embodiments, a logical high bit value may be determined if the count is greater than or equal to a threshold value, and a logical low bit value may be determined if the count is less than the threshold value.

In one or more embodiments, the decision/data recovery unit 270 may recover a data bit based on whether it is received during a time period of the processor clock signal 275. For example, in some embodiments, the decision/data recovery unit 270 may include an elastic buffer to store and release data bits in synchronization with time period(s) of the processor clock signal 275.

Note that the examples shown in FIGS. 1-3 are provided for the sake of illustration, and are not intended to limit any embodiments. For example, embodiments may include any number and/or arrangement of transmitters 110 and/or receivers 150. In another example, it is contemplated that some embodiments may include any number of components in addition to those shown, and that different arrangement of the components shown may occur in certain implementations. Further, it is contemplated that specifics in the examples shown in FIGS. 1-3 may be used anywhere in one or more embodiments.

Figure 4:
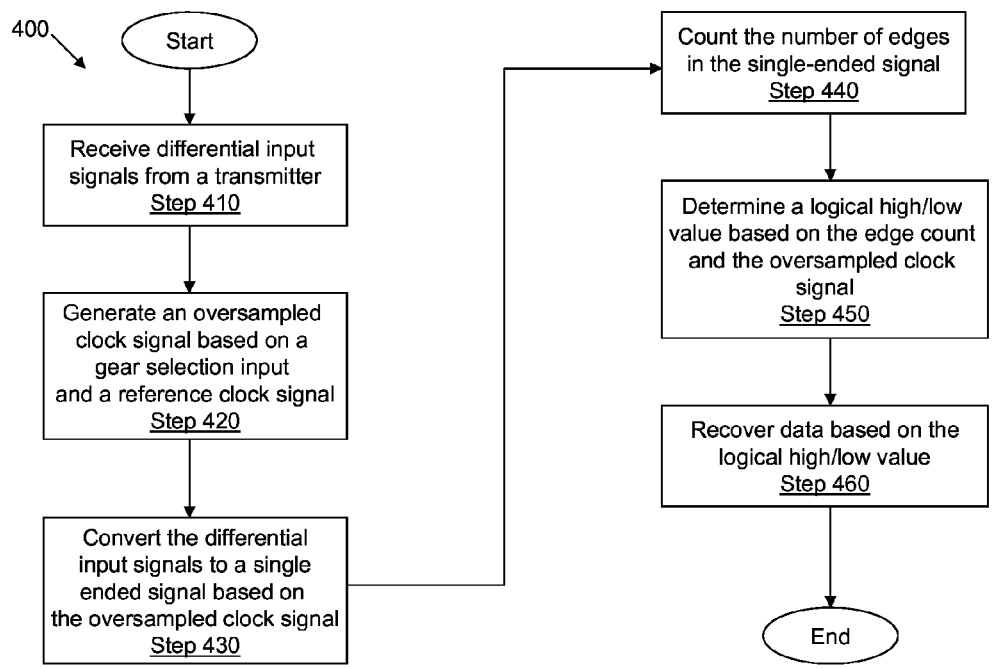
FIG. 4 is a flow chart of a method in accordance with one or more embodiments.

FIG. 4 shows a sequence 400 for data recovery in accordance with one or more embodiments. In one embodiment, the sequence 400 may be part of the receive logic 155 shown in FIG. 1. In other embodiments, the sequence 400 may be implemented by any other part of receiver 150. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, differential input signals may be received from a transmitter. For example, referring to FIG. 3, the sample and hold unit 220 may receive two differential signals input-p 201 and input-n 202. In some embodiments, the differential signals may be received from a transmitter (e.g., transmitter 110 shown in FIG. 1). In one or more embodiments, the received differential signals may be PWM signals under the M-PHY specification.

At step 420, an oversampled clock signal may be generated based on a gear selection input. In accordance with some embodiments, the gear selection input may be any identifier or datum indicative of an enumerated gear (e.g., G1-G7) defined by the MIPI Alliance's M-PHY specification or another specification. For example, referring to FIG. 3, the clock generator 205 may generate an input clock signal 206 based on the gear selection input 203. The rise/fall edge pulse generator 210 may then generate an oversampled clock signal 215 based on every rising and falling edge of the input clock signal 206. In one example, the frequency of the input clock signal 206 may be equivalent to six times the frequency of a reference clock signal (e.g., processor clock signal 275 shown in FIG. 3). Further, in this example, the frequency of the oversampled clock signal 215 may be equivalent to twelve times the frequency of the reference clock signal.

At step 430, the differential input signals (received at step 410) may be converted to a single-ended signal based on the oversampled clock signal. For example, referring to FIG. 3, the sample and hold unit 220 may sample and hold the differential signals input-p 201 and input-n 202 for some determined time period. Further, based on the oversampled clock signal 215, the differential-to-single conversion unit 230 may receive the differential signals 201, 202 from the sample and hold unit 220, and may convert the differential signals 201, 202 into the single-ended signal 235.

At step 440, the number of rising and falling edges may be counted for the single-ended signal. For example, referring to FIG. 3, the edge detector 240 may detect a rising edge in the single-ended signal 235, and may send a count-up indication in the edge signal 245 to the counter 260. Further, the edge detector 240 may detect a falling edge in the single-ended signal 235, and may send a count-down/reset indication in the edge signal 245 to the counter 260.

At step 450, a logical high or low value may be determined based on the edge count and the oversampled clock signal. For example, referring to FIG. 3, the counter 260 may increase or decrease a count based on the edge signal 245 during a time period of the oversampled clock signal 215. Further, the decision/data recovery unit 270 may determine a logical high bit value or a logical low bit value based on comparing the count signal 265 to a predefined threshold.

At step 460, data may be recovered based on the logical high or low value (determined at step 450). For example, referring to FIG. 3, the decision/data recovery unit 270 may recover a "1" data bit based on receiving a logical high value, or may recover a "0" data bit based on receiving a logical low value. Further, the decision/data recovery unit 270 may only recover a data bit if it is received during a time period of the processor clock signal 275. After step 460, the sequence 400 ends.

Figure 5:
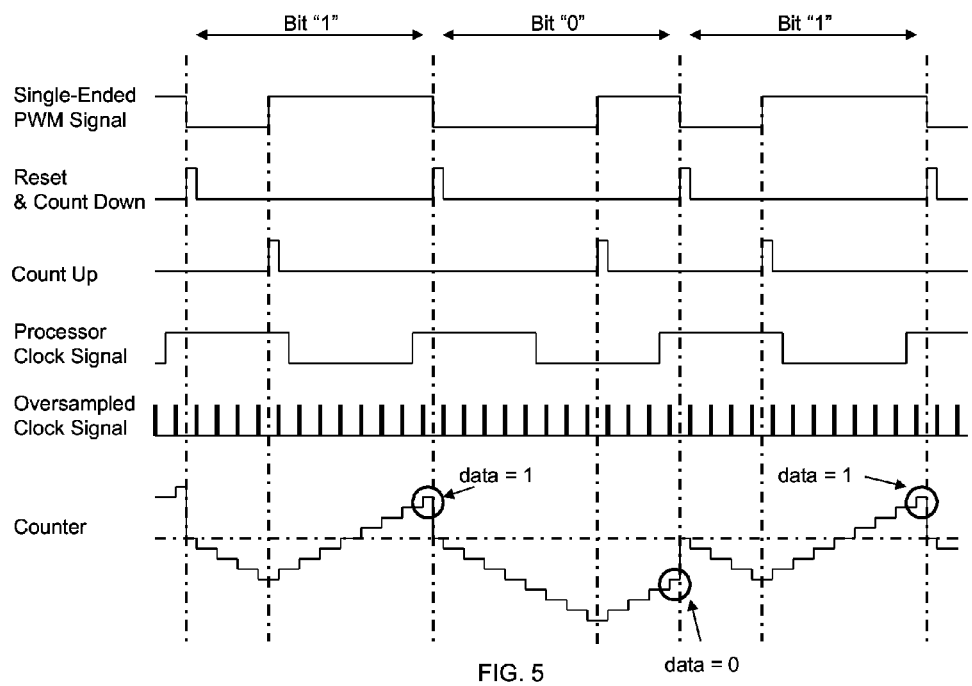
FIG. 5 is an example timing diagram in accordance with one or more embodiments.

Referring now to FIG. 5, shown is a timing diagram of a system in accordance with one or more embodiments. Specifically, depicted is a series of square wave forms representative of the pulse-width modulated (PWM) signals involved in the previously-discussed systems and process (e.g., a MIPI M-PHY receiver architecture). In reference to the counter signal, the x-axis is time and the y-axis is a count value. In reference to all the other shown signals, the x-axis is also time but the y-axis is voltage.

The first waveform shown in FIG. 5 is a single-ended PWM signal. As discussed above, the single-ended PWM signal may be provided when the differential-to-single conversion unit 230 processes the differential signals 201, 202.

The second and third waveforms shown in FIG. 5 are count-down and count-up forms of the edge signal 245, respectively. As shown, the second waveform indicates count-down spikes corresponding to falling edges of the single-ended PWM signal. Similarly, the third waveform indicates count-up spikes corresponding to rising edges of the single-ended PWM signal.

The fourth and fifth waveforms shown in FIG. 5 are a processor clock signal and an oversampled clock signal, respectively. As shown, the oversampled clock signal has a greater pulse frequency than the processor clock signal.

The sixth and final waveform shown in FIG. 5 is a counter signal. In some embodiments, the count is incremented, decremented, or reset on the basis of count-up and count-down/reset signals generated by the edge detector 240. Accordingly, the present bit value maintained by the counter 260 at the end of each timing period marked by the processor clock signal is translated into a logical high or low value for sending to the decision/data recovery unit 270. For example, the counter value is positive at the end of the first and third timing periods; as such, the bit value sent from the counter 260 to the decision/data recovery unit 270 is "1" or a high logical value. Conversely, the counter value is negative at the end of the second timing period; as such, the bit value sent from the counter 260 to the decision/data recovery unit 270 is "0" or a low logical value. As previously discussed, the decision/data recovery unit 270 performs data recovery based on the counter value received from the counter 260.

Figure 6:
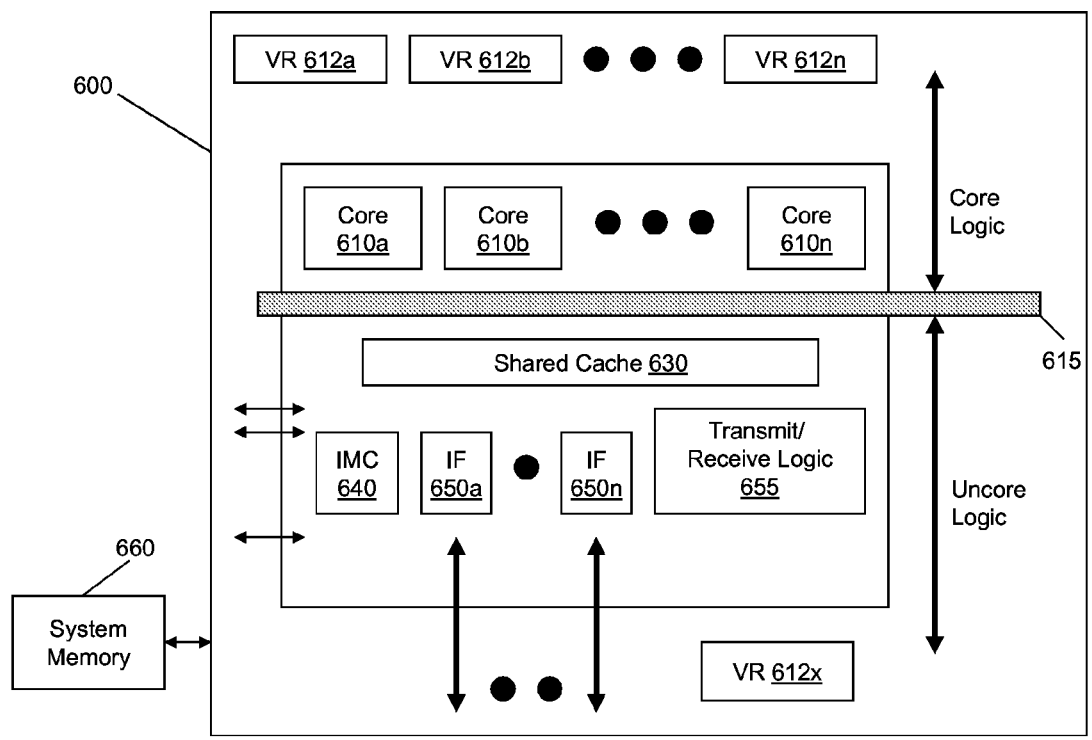
FIG. 6 is a block diagram of a processor in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and transmit/receive logic 655.

In one or more embodiments, transmit/receive logic 655 may include all or a portion of the receive logic 200 described above with reference to FIG. 3. Thus, the transmit/receive logic 655 may enable the cores 610a-610n to synchronize or align data transfer with other components (e.g., components included in a mobile computing device).

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
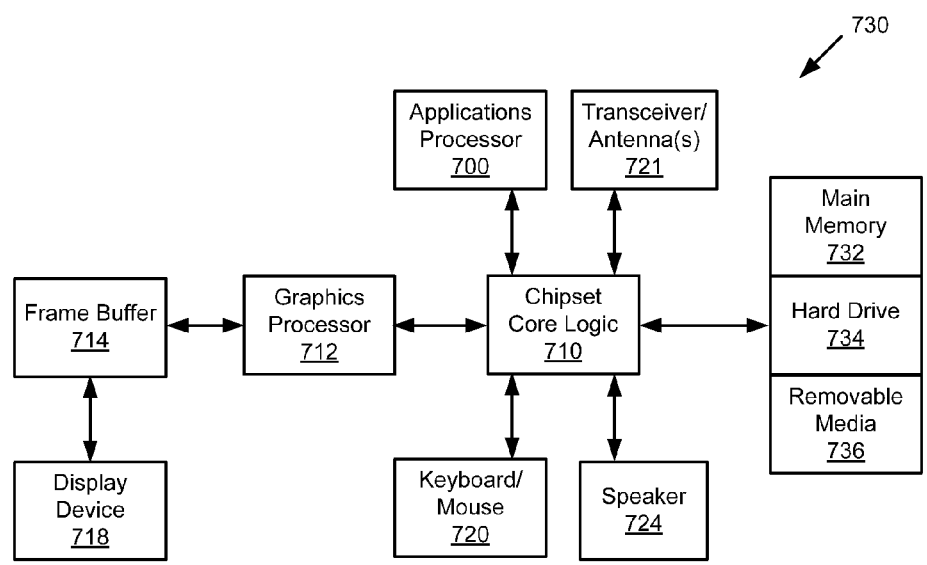
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multi-threaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721. Speakers 724 may also be coupled to core logic 710.

Figure 8:
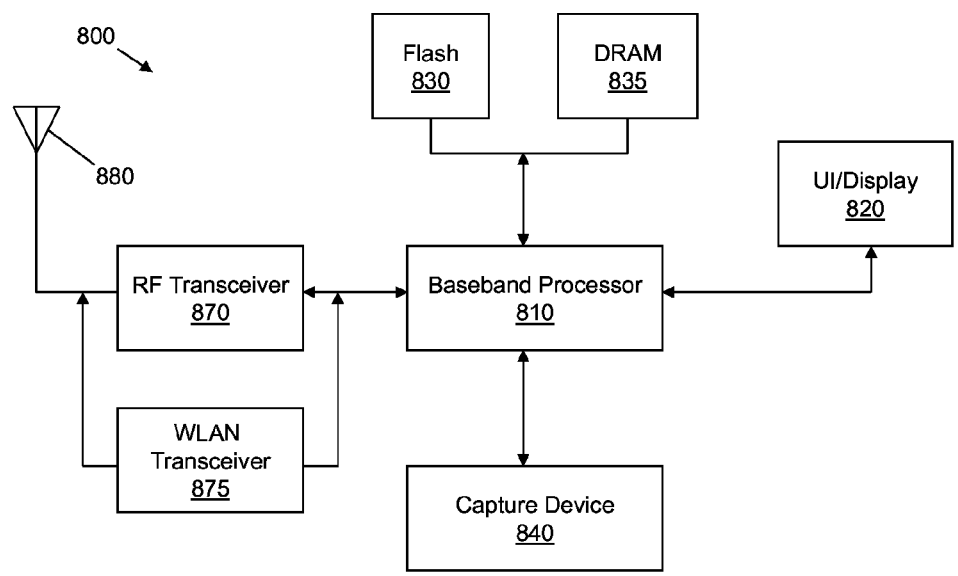
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display. In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images.

To enable communications to be transmitted and received, various circuitry may be coupled between baseband processor 810 and an antenna 880. Specifically, a radio frequency (RF) transceiver 870 and a wireless local area network (WLAN) transceiver 875 may be present. In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a pulse generator to generate an oversampled clock signal; a sample and hold unit to provide at least two differential input signals based on the oversampled clock signal; a conversion unit to generate a single-ended signal based on the at least two differential input signals; and a counter to determine a count of rising and falling edges of the single-ended signal based on the oversampled clock signal. The pulse generator may generate the oversampled clock signal based on rising edges and falling edges of an input clock signal. The apparatus may also include a clock generator to generate the input clock signal. The input clock signal may be a multiple of a processor clock signal. The apparatus may also include a decision/data recovery unit to recover data based on the count of rising and falling edges. The decision/data recovery unit may be to recover a logical high bit value if the count is greater than or equal to a threshold value. The decision/data recovery unit may also be to recover a logical low bit value if the count is less than the threshold value. The apparatus may also include an edge detector to detect the rising and falling edges of the single-ended signal. The sample and hold unit may be to sample each of the at least two differential input signals for a first time period. The sample and hold unit may be to hold each of the at least two differential input signals for a second time period. The sample and hold unit may also be to provide the at least two differential input signals based on a frequency of the oversampled clock signal. The counter may be to determine the count of rising and falling edges based on a time period of the oversampled clock signal. The at least two differential input signals may be Pulse Width Modulated (PWM) signals. The PWM signals may conform to the Mobile Industry Processor Interface (MIPI) M-PHY Specification.

Another example embodiment may be a system including: a system on a chip comprising at least one core having at least one execution unit and receiver logic, the receiver logic including a clock generator to generate an input clock signal, a pulse generator to generate an oversampled clock signal based on the input clock signal, a sample and hold unit to provide two or more differential input signals based on the oversampled clock signal, a conversion unit to generate a single-ended signal based on the two or more differential input signals, and a counter to determine a count of rising and falling edges of the single-ended signal based on the oversampled clock signal. The system may also include a wireless device coupled to the system on the chip via an interconnect, where the interconnect is used to communicate data between the wireless device and the receiver logic of the system on the chip. The receiver logic may also include a decision/data recovery unit to recover data based on the count of rising and falling edges. The decision/data recovery unit may include an elastic buffer synchronized to a processor clock signal. The receiver logic may also include an edge detector to detect the rising and falling edges of the single-ended signal. The clock generator may include a delay locked loop (DLL). The clock generator may include a phase locked loop (PLL). The clock generator may be to generate the input clock signal based on a gear selection input and a reference clock signal. The pulse generator may be to generate the oversampled clock signal based on rising edges and falling edges of the input clock signal.

Yet another example embodiment may be a method including: generating, in a receiver logic of a first device, an oversampled clock signal based on an input clock signal; sampling and holding a plurality of differential input signals based on the oversampled clock signal; generating a single-ended signal based on the plurality of differential input signals; and determining a count of rising and falling edges of the single-ended signal based on the oversampled clock signal. The method may also include generating the input clock signal based on a gear selection input and a reference clock signal. The method may also include recovering data based on the count of rising and falling edges of the single-ended signal. Generating the oversampled clock signal may be based on rising edges and falling edges of the input clock signal. The plurality of differential input signals may be pulse width modulated (PWM) signals.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
   at least one core;
   a receive logic coupled to the at least one core and comprising:
      a pulse generator to generate an oversampled clock signal;
      a sample and hold unit to provide at least two differential input signals based on the oversampled clock signal;
      a conversion unit to generate a single-ended signal based on the at least two differential input signals; and
      a counter to determine a count of rising and falling edges of the single-ended signal based on the oversampled clock signal.

2. The apparatus of claim 1, the pulse generator to generate the oversampled clock signal based on rising edges and falling edges of an input clock signal.

3. The apparatus of claim 2, further comprising a clock generator to generate the input clock signal.

4. The apparatus of claim 2, wherein the input clock signal is a multiple of a processor clock signal.

5. The apparatus of claim 1, further comprising a decision/data recovery unit to recover data based on the count of rising and falling edges.

6. The apparatus of claim 5, wherein the decision/data recovery unit is to recover a logical high bit value if the count is greater than or equal to a threshold value.

7. The apparatus of claim 6, wherein the decision/data recovery unit is to recover a logical low bit value if the count is less than the threshold value.

8. The apparatus of claim 1, further comprising an edge detector to detect the rising and falling edges of the single-ended signal.

9. The apparatus of claim 1, wherein the at least two differential input signals are Pulse Width Modulated (PWM) signals.

10. The apparatus of claim 9, wherein the PWM signals are to conform to the Mobile Industry Processor Interface (MIPI) M-PHY Specification.

11. The apparatus of claim 1, wherein the apparatus comprises a processor.

12. The apparatus of claim 11, further comprising a computer system comprising the processor.

13. A mobile system comprising:
   a system on a chip (SoC) comprising at least one core and a cache memory, the SoC further comprising a receiver logic, the receiver logic including:
      pulse generator to generate an oversampled clock signal,
      a sample and hold unit to provide at least two differential input signals based on the oversampled clock signal,
      a conversion unit to generate a single-ended signal based on the at least two differential input signals, and
      a counter to determine a count of rising and falling edges of the single-ended signal based on the oversampled clock signal;
   a radio frequency transceiver coupled to the SoC; and
   a touch screen display coupled to the SoC.

14. The mobile system of claim 13, wherein the mobile system comprises a smartphone.

15. The mobile system of claim 13, the pulse generator to generate the oversampled clock signal based on rising edges and falling edges of an input clock signal.

16. The mobile system of claim 15, further comprising a clock generator to generate the input clock signal.

17. A non-transitory machine-readable medium having stored thereon instructions, which if performed by a machine cause the machine to perform a method comprising:
   generating, in a receiver logic of a first device, an oversampled clock signal based on an input clock signal;
   sampling and holding a plurality of differential input signals based on the oversampled clock signal;
   generating a single-ended signal based on the plurality of differential input signals; and
   determining a count of rising and falling edges of the single-ended signal based on the oversampled clock signal.

18. The non-transitory machine-readable medium of claim 17, wherein the method further comprises generating the input clock signal based on a gear selection input and a reference clock signal.

* * * * *